United States Patent
Zhu et al.

(10) Patent No.: US 11,050,432 B2
(45) Date of Patent: Jun. 29, 2021

(54) PSEUDO DIFFERENTIAL ANALOG-TO-DIGITAL CONVERTER

(71) Applicant: Silergy Semiconductor Technology (Hangzhou) LTD, Hangzhou (CN)

(72) Inventors: Xunyu Zhu, Hangzhou (CN); Lele Jin, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/849,084

(22) Filed: Apr. 15, 2020

(65) Prior Publication Data

US 2020/0343900 A1    Oct. 29, 2020

(30) Foreign Application Priority Data

Apr. 24, 2019    (CN) .......................... 201910335932.4

(51) Int. Cl.
  *H03M 1/38* (2006.01)
  *H03M 1/46* (2006.01)
(52) U.S. Cl.
  CPC .................................. *H03M 1/466* (2013.01)
(58) Field of Classification Search
  CPC ........... H03M 1/466; H03M 1/12; H03M 1/00
  USPC ......................................... 341/144, 155, 172
  See application file for complete search history.

(56) References Cited

U.S. PATENT DOCUMENTS

| | | | |
|---|---|---|---|
| 6,674,386 B2 | 1/2004 | Carreau et al. | |
| 6,756,928 B2 | 6/2004 | Kawahito et al. | |
| 7,525,469 B2 | 4/2009 | Tsai | |
| 7,916,060 B2 | 3/2011 | Zhu et al. | |
| 8,059,022 B2 | 11/2011 | Cho et al. | |
| 8,416,116 B2* | 4/2013 | Chang | H03M 1/002 341/172 |
| 8,749,213 B2 | 6/2014 | Chen | |
| 9,219,493 B1 | 12/2015 | Kunnen et al. | |
| 10,270,459 B2* | 4/2019 | Fan | H03M 1/002 |
| 2008/0309537 A1 | 12/2008 | Seo et al. | |
| 2016/0072487 A1* | 3/2016 | Hwang | H03K 5/023 327/306 |

* cited by examiner

*Primary Examiner* — Peguy Jean Pierre
(74) *Attorney, Agent, or Firm* — Michael C. Stephens, Jr.

(57) ABSTRACT

A pseudo differential analog-to-digital converter includes: a first capacitor array and a second capacitor array respectively coupled to input terminals of an analog-to-digital circuit; where an output terminal of the first capacitor array receives a first reference voltage, and an output terminal of the second capacitor array receives a second reference voltage; and where a difference between the first and second reference voltages is set between zero and a peak value of an analog input signal.

10 Claims, 5 Drawing Sheets

US 11,050,432 B2

PSEUDO DIFFERENTIAL ANALOG-TO-DIGITAL CONVERTER

RELATED APPLICATIONS

This application claims the benefit of Chinese Patent Application No. 201910335932.4, filed on Apr. 24, 2019, which is incorporated herein by reference in its entirety.

FIELD OF THE INVENTION

The present invention generally relates to the field of semiconductor integrated circuits, and more particularly to analog-to-digital converters.

BACKGROUND

In some applications for interface circuits of sensors, signals to be detected are single ended signals (e.g., battery electricity, temperature, etc.). However, the ability for interference resistance may not be strong enough, and directly sampling signals by an analog-to-digital converter can result in a loss of precision. Thus, a single ended signal can be converted into a differential signal before being input to the analog-to-digital converter. If the analog-to-digital converter is high precision, the circuit for converting the single ended signal to the differential signal may not guarantee a wide dynamic range of an output signal. Therefore, the pre-circuit for converting a single ended signal to a differential signal may generally not be used in high precision analog-to-digital converters. A pseudo differential approach can also be used for sampling single ended signals, where the change direction of single ended signals are single such that a range of an output signal of the analog-to-digital converter can be half of the original range of the output signal.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
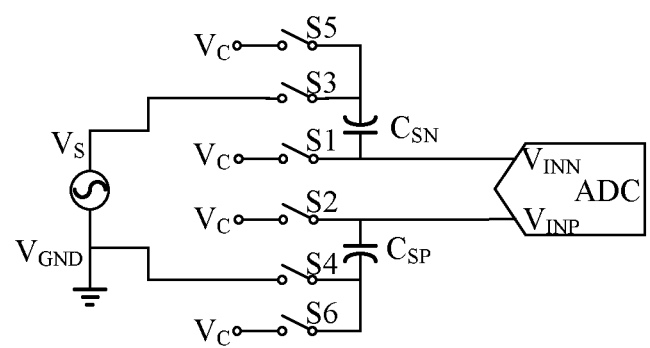
FIG. 1 is a schematic block diagram of an example pseudo differential analog-to-digital converter.

Referring now to FIG. 1, shown is a schematic block diagram of an example pseudo differential analog-to-digital converter. In this example, the pseudo differential analog-to-digital converter can include capacitor array $C_{SN}$, capacitor array $C_{SP}$, and analog-to-digital circuit ADC. Also, output terminals of capacitor arrays $C_{SN}$ and $C_{SP}$ can connect to inverting input terminal $V_{INN}$ and non-inverting input terminal $V_{INP}$ of analog-to-digital circuit ADC, respectively. Further, both output terminals of capacitor arrays $C_{SN}$ and $C_{SP}$ can receive voltage $V_C$. Here, a top plate of capacitor array $C_{SN}$ can be set as the output terminal of capacitor array $C_{SN}$, and a bottom plate of capacitor array $C_{SN}$ may be selectively coupled to one of a corresponding terminal of analog input signal $V_S$ and voltage $V_C$. A top plate of capacitor array $C_{SP}$ can be set as the output terminal of capacitor array $C_{SP}$, and a bottom plate of capacitor array $C_{SP}$ can be selectively coupled to one of another corresponding terminal of analog input signal $V_S$ and voltage $V_C$.

For example, the output terminal of capacitor array $C_{SN}$ can be coupled to voltage $V_C$ via switch S1, and can connect to inverting input terminal $V_{INN}$ of analog-to-digital circuit ADC at the same time. Also, the anode of analog input signal $V_S$ can be coupled to the bottom plate of capacitor array $C_{SN}$ via switch S3, and voltage $V_C$ can be coupled to the bottom plate of capacitor array $C_{SN}$ via switch S5. Moreover, the output terminal of capacitor array $C_{SP}$ is coupled to voltage $V_C$ via switch S2, and can connect to non-inverting input terminal $V_{INP}$ of analog-to-digital circuit ADC at the same time. Also, the cathode of analog input signal $V_S$ can be coupled to the bottom plate of capacitor array $C_{SP}$ via switch S4, and voltage $V_C$ can be coupled to the bottom plate of capacitor array $C_{SP}$ via switch S6.

Analog input signal $V_S$ can be a single ended signal, and the cathode of analog input signal $V_S$ can connect to ground. Here, the peak value of analog input signal $V_S$ is $V_P$. In this particular example, positive reference voltage $V_{REFP}$ of the analog-to-digital circuit ADC is peak value $V_p$ of analog input signal $V_S$, and negative reference voltage $V_{REFN}$ of the analog-to-digital circuit ADC is 0. For example, voltage $V_C$ is half of the sum of positive reference voltage $V_{REFP}$ and negative reference voltage $V_{REFN}$; that is: $VC=(V_{REFP}+V_{REFN})/2=V_{REFP}/2=V_p/2$.

Moreover, both the equivalent capacitance of capacitor array $C_{SN}$ and the equivalent capacitance of capacitor array $C_{SP}$ can be set to be Cs in this example. It should be understood by those skilled in the art that the capacitor arrays can include one or more capacitor(s) coupled together to be with the equivalent capacitance. In the first step of the sampling process of analog input signal Vs, switches S1-S4 may be turned on and switches S5 and S6 turned off.

In that case, the charge of capacitor array $C_{SN}$ is shown in formula (1):

$$Q_{CSP}=C_S(V_C-V_{GND}) \quad (1)$$

The charge of capacitor array $C_{SP}$ is shown in formula (2):

$$Q_{CSN}=C_S(V_C-V_S) \quad (2)$$

In the second step of the sampling process of analog input signal $V_S$, switches S1-S4 can be turned off and switches S5 and S6 turned on. At that time, the voltage at inverting input terminal $V_{INN}$ and the voltage at non-inverting input terminal $V_{INP}$ can satisfy the following formulas (3) and (4) according to law of conservation of electric charge:

$$Q_{CSP}=C_S(V_{INP}-V_C) \quad (3)$$

$$Q_{CSN}=C_S(V_{INN}-V_C) \quad (4)$$

Combing formulas (1) and (3), and formulas (2) and (4), respectively, the voltage at inverting input terminal $V_{INN}$ and the voltage at non-inverting input terminal $V_{INP}$ can be obtained, that is as below in formulas (5) and (6):

$$V_{INP}=2V_C-V_{GND}=V_{REFP} \quad (5)$$

$$V_{INN}=2V_C-V_S=V_{REFP}-V_S \quad (6)$$

According to formulas (5) and (6), the practical differential signal of analog-to-digital circuit ADC can be calculated, that is has below in formula (7):

$$V_{INP}-V_{INN}=V_S \quad (7)$$

It can be seen from formula (7) that the practical differential signal of analog-to-digital circuit ADC is analog input signal Vs. However, the range of analog input signal Vs is between 0 and peak value $V_p$, and the practical differential signal only includes positive voltages without including negative voltages. Thus, the range of the output signal of analog-to-digital circuit ADC is half of the preset range.

Figure 2:
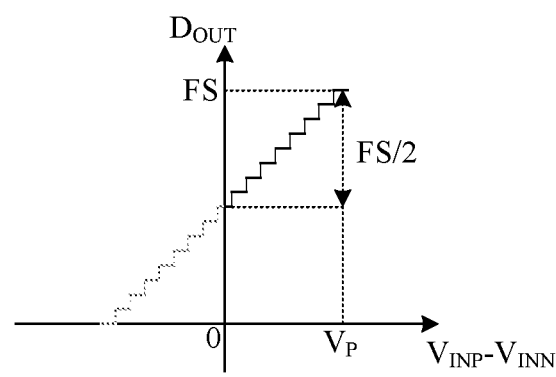
FIG. 2 is an input-output characteristic diagram of an example pseudo differential analog-to-digital converter.

Referring now to FIG. 2, shown is an input-output characteristic diagram of an example pseudo differential analog-to-digital converter. In this particular example, the range of the input voltage of analog-to-digital circuit ADC is between 0 and peak value $V_p$, and the range of the output signal of analog-to-digital circuit ADC is between FS/2 and FS. Here, FS is the full range of the output signal of analog-to-digital circuit ADC.

In one embodiment, a pseudo differential analog-to-digital converter can include: (i) a first capacitor array and a second capacitor array respectively coupled to input terminals of an analog-to-digital circuit; (ii) where an output terminal of the first capacitor array receives a first reference voltage, and an output terminal of the second capacitor array receives a second reference voltage; and (iii) where a difference between the first and second reference voltages is set between zero and a peak value of an analog input signal.

Figure 3:
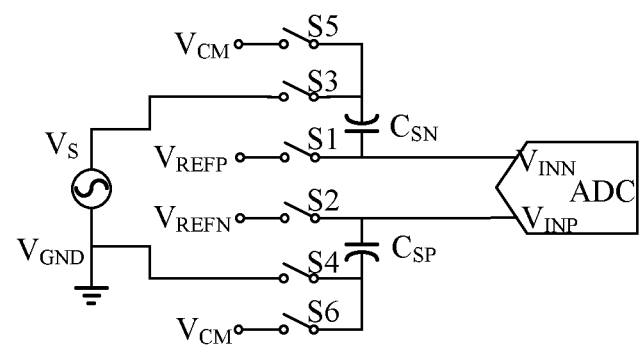
FIG. 3 is a schematic block diagram of an example pseudo differential analog-to-digital converter, in accordance with embodiments of the present invention.

Referring now to FIG. 3, shown is a schematic block diagram of an example pseudo differential analog-to-digital converter, in accordance with embodiments of the present invention. In this particular example, the pseudo differential analog-to-digital converter can include capacitor array $C_{SN}$, capacitor array $C_{SP}$, and analog-to-digital circuit ADC. Also, output terminals of capacitor arrays $C_{SN}$ and $C_{SP}$ can be coupled to inverting input terminal $V_{INN}$ and non-inverting input terminal $V_{INP}$ of analog-to-digital circuit ADC, respectively. Further, the output terminals of capacitor arrays $C_{SN}$ and $C_{SP}$ can receive reference voltage $V_{REFP}$ and reference voltage $V_{REFN}$, respectively. As described herein, the "first" reference voltage is positive reference voltage $V_{REFP}$ of analog-to-digital circuit ADC, and the "second" reference voltage is negative reference voltage $V_{REFN}$ of analog-to-digital circuit ADC. Moreover, positive reference voltage $V_{REFP}$ is between 0 and peak value $V_p$ of analog input signal $V_s$, and negative reference voltage $V_{REFN}$ is 0. For example, positive reference voltage $V_{REFP}$ is half of peak value $V_p$ of analog input signal $V_S$. Further, analog input signal $V_S$ is a single ended signal, and the cathode of analog input signal $V_S$ can connect to ground.

Similarly, the top plates of capacitor arrays $C_{SN}$ and $C_{SP}$ can be set to be output terminals of capacitor arrays $C_{SN}$ and $C_{SP}$, respectively. Further, the bottom plates of capacitor arrays $C_{SN}$ and $C_{SP}$ can also be coupled to a fixed voltage. Alternatively, the fixed voltage can be common mode voltage $V_{CM}$, and the common mode voltage $V_{CM}$ is between 0 and positive reference voltage $V_{REFP}$. For example, common mode voltage $V_{CM}$ can be half of the sum of positive reference voltage $V_{REFP}$ and negative reference voltage $V_{REFN}$. When negative reference voltage $V_{REFN}$ is zero, common mode voltage $V_{CM}$ satisfies the following formula: $V_{CM}=(V_{REFP}+V_{REFN})/2=V_{REFP}/2=V_p/4$. Under that circumstance, common mode voltage $V_{CM}$ is half of positive reference voltage $V_{REFP}$.

For example, the bottom plate of capacitor array $C_{SN}$ can be selectively coupled to one of a corresponding terminal of analog input signal $V_S$ and common mode voltage $V_{CM}$, and the bottom plate of capacitor array $C_{SP}$ may be selectively coupled to one of another corresponding terminal of analog input signal $V_S$ and common mode voltage $V_{CM}$. For example, the output terminal of capacitor array $C_{SN}$ can be coupled to positive reference voltage $V_{REFP}$ via switch S1, and coupled to inverting input terminal $V_{INN}$ of analog-to-digital circuit ADC at the same time. Also, the anode of analog input signal Vs can be coupled to the bottom plate of capacitor array $C_{SN}$ via switch S3, and common mode voltage $V_{CM}$ can be coupled to the bottom plate of capacitor array $C_{SN}$ via switch S5. The output terminal of capacitor array $C_{SP}$ can be coupled to negative reference voltage $V_{REFN}$ via switch S2, and coupled to non-inverting input terminal $V_{INP}$ of analog-to-digital circuit ADC at the same time. Also, the cathode of analog input signal Vs can be coupled to the bottom plate of capacitor array $C_{SP}$ via switch S4, and common mode voltage $V_{CM}$ may be coupled to the bottom plate of capacitor array $C_{SP}$ via switch S6.

It should be understood that the bottom plate of capacitor array $C_{SN}$ can be selectively coupled to one of the corresponding terminal of analog input signal $V_S$ and one fixed voltage by a switch. Also, the bottom plate of capacitor array $C_{SP}$ can be selectively coupled to the another corresponding terminal of analog input signal $V_S$ and the one fixed voltage by a single pole multi throw switch. For example, switches S3 and S5 can be replaced by a single pole multi throw switch in certain embodiments. Similarly, switches S4 and S6 can also each be replaced by a single pole multi throw switch.

In addition, both equivalent capacitance of first capacitor array $C_{SN}$ and equivalent capacitance of capacitor array $C_{SP}$ can be set to be Cs in this example. In FIG. 3, in the first step of the sampling process of analog input signal $V_S$, switches S1-S4 can be turned on and switches S5 and S6 turned off. In that case, the charge of capacitor array $C_{SN}$ and the charge of capacitor array $C_{SP}$ respectively may satisfy the following formulas (8) and (9):

$$Q_{CSP}=C_S(V_{REFN}-V_{GND}) \quad (8)$$

$$Q_{CSN}=C_S(V_{REFP}-V_S) \quad (9)$$

In the second step of the sampling process of analog input signal $V_S$, switches S1-S4 can be turned off and switches S5 and S6 turned on. At that time, the voltage at inverting input terminal $V_{INN}$ and the voltage of non-inverting input terminal $V_{INP}$ can satisfy the following formulas (10) and (11) according to law of conservation of electric charge:

$$Q_{CSP}=C_S(V_{INP}-V_{CM}) \quad (10)$$

$$Q_{CSN}=C_S(V_{INN}-V_{CM}) \quad (11)$$

Combing formulas (8) and (10), and formulas (9) and (11), respectively, the voltage at non-inverting input terminal $V_{INP}$ and the voltage at inverting input terminal $V_{INN}$ can be obtained as below in formulas (12) and (13):

$$V_{INP}=V_{REFN}-V_{GND}+V_{CM} \quad (12)$$

$$V_{INN}=V_{REFP}-V_S+V_{CM} \quad (13)$$

According to formulas (12) and (13), the practical differential signal of analog-to-digital circuit ADC can be calculated as below in formula (14); that is:

$$V_{INP}-V_{INN}=V_S-(V_{REFP}-V_{REFN}) \quad (14)$$

It can be seen from formula (14) that the practical differential signal of analog-to-digital circuit ADC is the difference between analog input signal VS and a difference between positive reference voltage $V_{REFP}$ (i.e., the first reference voltage) and negative reference voltage $V_{REFN}$ (i.e., the second reference voltage). Thus, the practical differential signal can be positive or negative. If the difference between positive reference voltage $V_{REFP}$ and negative reference voltage $V_{REFN}$ is properly set, the range of the output signal of analog-to-digital circuit ADC can be extended. In this particular example, negative reference voltage $V_{REFN}$ is zero, and analog input signal Vs ranges from 0 to $V_P$. Thus, positive reference voltage $V_{REFP}$ can be set between 0 and $V_P$, such that the differential signal received by analog-to-digital circuit ADC can be extended to the negative portion. For example, positive reference voltage $V_{REFP}$ can be set to be half of peak value $V_p$.

Figure 4:
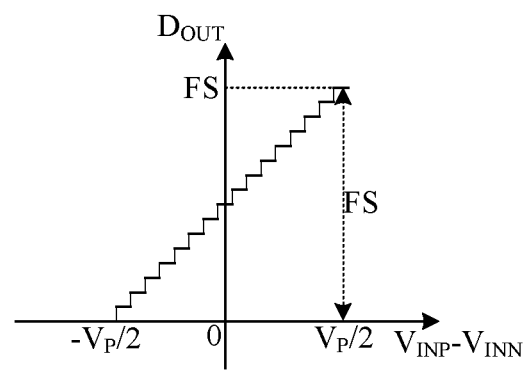
FIG. 4 is an input-output characteristic diagram of an example pseudo differential analog-to-digital converter, in accordance with embodiments of the present invention.

Referring now to FIG. 4, shown is an input-output characteristic diagram of an example pseudo differential analog-to-digital converter, in accordance with embodiments of the present invention. In this particular example, the range of the input signal of analog-to-digital circuit ADC is between $-V_p/2$ and $V_p/2$, and the range of the output signal of analog-to-digital circuit ADC is between 0 and FS. Here, FS is the preset full change. Thus, the practical differential signal received by analog-to-digital circuit ADC can be positive or negative. In view of the above, the range of the output signal of the pseudo differential analog-to-digital converter can be extended by changing voltages of the output terminals of the two capacitor arrays, and by properly setting positive reference voltage $V_{REFP}$, without changing the structure of the circuit.

Figure 5:
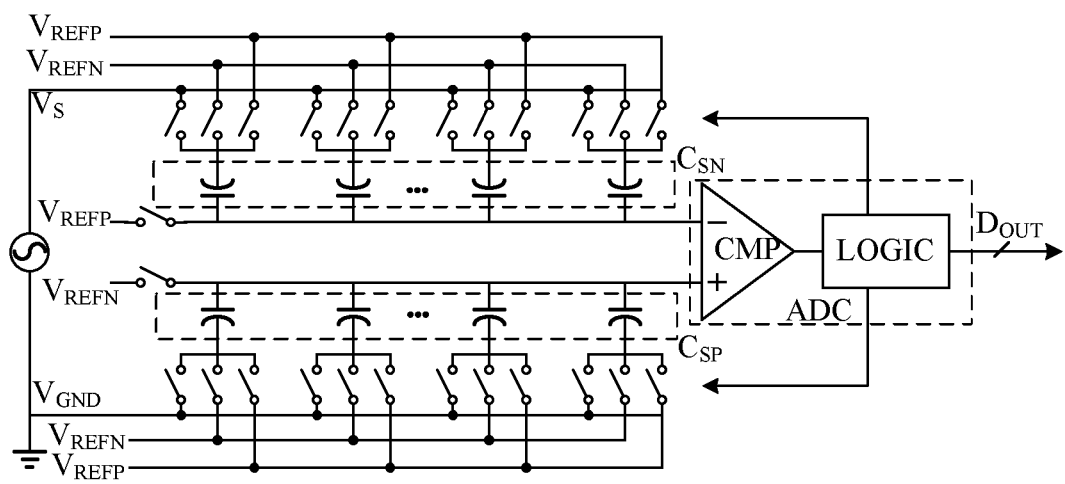
FIG. 5 is a schematic block diagram of an example pseudo differential successive approximation register analog-to-digital converter, in accordance with embodiments of the present invention.

Referring now to FIG. 5, shown is a schematic block diagram of an example pseudo differential successive approximation register analog-to-digital converter, in accordance with embodiments of the present invention. In this example, the pseudo differential successive approximation register analog-to-digital converter can include capacitor array $C_{SN}$, capacitor array $C_{SP}$, and analog-to-digital circuit ADC. Capacitor array $C_{SN}$ can include multiple capacitors coupled in parallel and the top plates of the multiple capacitors in capacitor array $C_{SN}$ can be coupled as the output terminal of capacitor array $C_{SN}$. Similarly, capacitor array $C_{SP}$ can include multiple capacitors coupled in parallel and the top plates of the multiple capacitors in capacitor array $C_{SP}$ can be coupled as the output terminal of capacitor array $C_{SP}$. Moreover, the bottom plate of each of the multiple capacitors in capacitor arrays $C_{SN}$ and $C_{SP}$ can be selectively coupled to a corresponding input terminal of the analog input signal and two fixed voltages respectively through switches.

Here, the two fixed voltages are reference voltages $V_{REFP}$ and $V_{REFN}$. Also, the analog-to-digital circuit ADC can include comparator CMP and logic circuit LOGIC. In this case, the output terminals of capacitor array $C_{SN}$ and capacitor array $C_{SP}$ can be coupled to the two input terminals of comparator CMP, respectively. Logic circuit LOGIC can receive the output signal of comparator CMP, and may thereby generate the output signal of analog-to-digital circuit ADC. In addition, logic circuit LOGIC can control the on and off states of the switches coupled to capacitor arrays $C_{SN}$ and $C_{SP}$. Thus, the bottom plates of capacitor arrays $C_{SN}$ and $C_{SP}$ can be equivalent to being coupled to common mode voltage $V_{CM}$. For pseudo differential successive approximation register analog-to-digital converter in certain embodiments, the differential signal received by analog-to-digital circuit ADC can be also extended to the negative portion, such that the range of the output signals of analog-to-digital circuit ADC may be extended.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A pseudo differential analog-to-digital converter, comprising:
    a) a first capacitor array and a second capacitor array respectively coupled to input terminals of an analog-to-digital circuit;
    b) wherein an output terminal of the first capacitor array receives a first reference voltage, and an output terminal of the second capacitor array receives a second reference voltage; and
    c) wherein the first reference voltage is set between zero and a peak value of an analog input signal, and the second reference voltage is set to be zero.

2. The pseudo differential analog-to-digital converter of claim 1, wherein the first reference voltage is half of the peak value of the analog input signal.

3. The pseudo differential analog-to-digital converter of claim 1, wherein:
    a) a top plate of the first capacitor array is set as the output terminal of the first capacitor array, and a bottom plate of the first capacitor array is selectively coupled to one of a corresponding terminal of the analog input signal and at least one fixed voltage; and
    b) a top plate of the second capacitor array is set as the output terminal of the second capacitor array, and a bottom plate of the second capacitor array is selectively coupled to one of another corresponding terminal of the analog input signal and the at least one fixed voltage.

4. The pseudo differential analog-to-digital converter of claim 3, wherein:
    a) the bottom plate of the first capacitor array is coupled to an anode of the analog input signal; and
    b) the bottom plate of the second capacitor array is coupled to a cathode of the analog input signal.

5. The pseudo differential analog-to-digital converter of claim 4, wherein:
    a) both the bottom plate of the first capacitor array and the bottom plate of the second capacitor array are coupled to one fixed voltage; and
    b) the fixed voltage is a common mode voltage set between zero and the first reference voltage.

6. The pseudo differential analog-to-digital converter of claim 5, wherein the common mode voltage is half of the sum of the first and second reference voltages.

7. The pseudo differential analog-to-digital converter of claim 4, wherein:

a) both the bottom plate of the first capacitor array and the bottom plate of the second capacitor array are coupled to two fixed voltages; and
b) the two fixed voltages are the first and second reference voltages.

8. The pseudo differential analog-to-digital converter of claim 7, being configured as a pseudo differential successive approximation register analog-to-digital converter.

9. The pseudo differential analog-to-digital converter of claim 3, wherein:
a) the bottom plate of the first capacitor array is selectively coupled to one of the corresponding terminal of the analog input signal and the at least one fixed voltage by a single pole multi throw switch; and
b) the bottom plate of the second capacitor array is selectively coupled to the another corresponding terminal of the analog input signal and the at least one fixed voltage by a single pole multi throw switch.

10. The pseudo differential analog-to-digital converter of claim 1, wherein an equivalent capacitance of the first capacitor array is the same as an equivalent capacitance of the second capacitor array.

\* \* \* \* \*